United States Patent
Sosnowchik et al.

(10) Patent No.: US 7,452,800 B2
(45) Date of Patent: Nov. 18, 2008

(54) BONDING A NON-METAL BODY TO A METAL SURFACE USING INDUCTIVE HEATING

(75) Inventors: Brian D. Sosnowchik, Walnut Creek, CA (US); Liwei Lin, Castro Valley, CA (US); Albert P. Pisano, Danville, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 11/598,244

(22) Filed: Nov. 9, 2006

(65) Prior Publication Data

US 2007/0105341 A1    May 10, 2007

Related U.S. Application Data

(60) Provisional application No. 60/735,420, filed on Nov. 9, 2005.

(51) Int. Cl.
*H01L 21/44* (2006.01)
(52) U.S. Cl. .............................. 438/615; 257/E21.084
(58) Field of Classification Search ................. 438/117, 438/122, 615, 657; 257/E21.088, E21.48, 257/E21.084
See application file for complete search history.

(56) References Cited

U.S. PATENT DOCUMENTS

| | | | | |
|---|---|---|---|---|
| 3,331,996 A | * | 7/1967 | Green | 257/763 |
| 4,562,121 A | * | 12/1985 | Thiemann et al. | 428/607 |
| 4,602,731 A | * | 7/1986 | Dockus | 228/121 |
| 6,062,461 A | * | 5/2000 | Sparks et al. | 228/123.1 |
| 6,905,945 B1 | * | 6/2005 | Barmatz et al. | 438/455 |
| 2005/0288604 A1 | * | 12/2005 | Eigler et al. | 600/561 |
| 2006/0197215 A1 | * | 9/2006 | Potter | 257/704 |

OTHER PUBLICATIONS

Wojciechowski, et a., "A MEMS Resonant Strain Sensor Operated in Air," presented at the 17th IEEE International Conference on Micro Electro Mechanical Systems, Maastricht, The Netherlands, Jan. 2004.

Peterson, et al., "Processing and Characterization of Diffusion-Bonded Al-Si Interfaces," *Journal of Materials Processing Technology*, vol. 145, pp. 99-108, 2004.

(Continued)

*Primary Examiner*—W. David Coleman
(74) *Attorney, Agent, or Firm*—Weaver Austin Villeneuve & Sampson LLP

(57) ABSTRACT

A bonding technique suitable for bonding a non-metal body, such as a silicon MEMS sensor, to a metal surface, such a steel mechanical component is rapid enough to be compatible with typical manufacturing processes, and avoids any detrimental change in material properties of the metal surface arising from the bonding process. The bonding technique has many possible applications, including bonding of MEMS strain sensors to metal mechanical components. The inventive bonding technique uses inductive heating of a heat-activated bonding agent disposed between metal and non-metal objects to quickly and effectively bond the two without changing their material properties. Representative tests of silicon to steel bonding using this technique have demonstrated excellent bond strength without changing the steel's material properties. Thus, with this induction bonding approach, silicon MEMS devices can be manufacturably bonded to mechanical steel components for real time monitoring of the conditions/environment of a steel component.

34 Claims, 5 Drawing Sheets

Skin Depth, $\delta$ $$\delta = \sqrt{\frac{\rho}{\pi \mu_r \mu_o F}}$$

$\rho$ – Resistivity
$F$ – Applied Frequency
$\mu_r$ – Relative Magnetic Permeability Power Density, $I$ $$I = I_0 e^{-x/\delta}$$

OTHER PUBLICATIONS

Polanco, et al., "Metal-Ceramic Interfaces: Joining Silicon Nitride-Stainless Steel," *Applied Surface Science*, vol. 238, pp. 506-512, 2004.

C. Luo et al., "The Application of Nanosecond-Pulsed Laser Welding Technology in MEMS Packaging with a Shadow Mask," *Sensors and Actuators A*, vol. 97-98, pp. 398-404, 2002.

N. K. Budraa, et al., "Low Pressure and Low Temperature Hermetic Wafer Bonding Using Microwave Heating," presented at the 12th IEEE International Conference on Micro Electro Mechanical Systems, Orlando, FL, Jan. 1999.

Y. T. Cheng, et al., "Localized Silicon Fusion and Eutectic Bonding for MEMS Fabrication and Packaging," *Journal of Microelectromechanical Systems*, vol. 9, pp. 3-8, 2000.

L. Lin, et al., "Formation of Silicon-Gold Eutectic Bond Using Localized Heating Method," *Japanese Journal of Applied Physics Part 2—Letters*, vol. 37, pp. 1412-1414, 1998.

Q. Tan, et al., "Thermosonic Flip-Chip Bonding Using Longitudinal Ultrasonic Vibration," *IEEE Transactions on Components, Packaging, and Manufacturing Technology—Part B*, vol. 21, pp. 53-58, 1998.

J. Kim, et al., "Ultrasonic Bonding of In/Au and Al/Al for Hermetic Sealing of MEMS Packaging," presented at the 15th IEEE International Conference on Micro Electro Mechanical Systems, Las Vegas, NV, Jan. 2002.

Cheng et al., "A Hermetic Glass-Silicon Package Formed Using Localized Aluminum/Silicon-Glass Bonding," Journal of Microelectromechanical Systems, vol. 10, No. 3, Sep. 2001, pp. 392-399.

Chen et al., "Study on the Effects of Wafer Thinning and Dicing on Chip Strength," IEEE Transactions on Advanced Packaging, 2005, pp. 1-9.

Chiao et al., "Hermetic wafer bonding based on rapid thermal processing," Sensors and Actuators A 91 (2001) 398-402.

Mescheder et al., "Local laser bonding for low temperature budget," Sensors and Actuators A 97-98 (2002) 422-427.

Yang et al., "Localized induction heating solder bonding for wafer level MEMS packaging," Institute of Physics Publishing, Journal of Micromechanics and Microengineering, J. Micromech.Microeng. 15 (2005) 394-399.

Lee et al., "Wafer bonding by low-temperature soldering," Sensors and Actuators 85 (2000) 330-334.

Cao et al., "Rapid Low Temperature Bonding of Silicon to Steel for MEMS Sensors," Proceedings of IMECE2004, 2004 ASME International Mechanical Engineering Congress and R&D Expo, Nov. 13-19, 2004, pp. 1-7.

Sosnowchik et al., "Rapid Silicon-To-Steel Bonding Using Inductive Heating," Proceedings of IMECE2006, 2006 ASME International Mechanical Engineering Congress and Exposition, Nov. 5-10, 2006, pp. 1-8.

Sosnowchik et al., "Silicon-to-Steel Bonding Using Rapid Thermal Annealing," IEEE Transactions on Advanced Packaging, vol. 28, No. 4, Nov. 2005, pp. 626-634.

PCT patent application No. PCT/US06/44019, International Search Report mailed Sep. 25, 2007.

PCT patent application No. PCT/US06/44019, Written Opinion mailed Sep. 25, 2007.

* cited by examiner

APPLIED FORCES

Steel
204

Silicon-based strain sensor
202

BONDING A NON-METAL BODY TO A METAL SURFACE USING INDUCTIVE HEATING

CROSS-REFERENCE TO RELATED APPLICATIONS

This application claims priority to U.S. Provisional Patent Application No. 60/735,420, filed Nov. 9, 2005, titled SILICON TO STEEL BONDING USING INDUCTIVE HEATING, the disclosure of which is incorporated herein by reference in its entirety and for all purposes.

STATEMENT OF GOVERNMENT SUPPORT

This application was made with Government support under an Army Research Office Grant No. DAAD 19-02-1-0198. The Government has certain rights to this invention.

BACKGROUND OF THE INVENTION

The present invention relates generally to method of bonding metals and non-metals using inductive heating. The method is advantageously applicable to the bonding of silicon to steel, such as for placing silicon MEMS strain sensors on steel mechanical components, such as bearing races.

Micro-electromechanical systems (MEMS) is a technology encompassing the integration of mechanical elements, such as structures and actuators, with electronics on a common silicon substrate through micro-fabrication technology. The electronics are fabricated using well established semiconductor processing process techniques (e.g., metal oxide silicon (e.g., NMOS, PMOS and CMOS processes)), and the micromechanical components are fabricated using compatible "micromachining" processes that selectively etch away parts of the silicon wafer or add new structural layers to form the mechanical and electromechanical devices.

Advancements in the MEMS field have seen the development of realizable complex devices and sensors. MEMS sensors, such as accelerometers, gas sensors, pressure sensors, and others have become so refined and reliable that their detection abilities can function, in theory, while bonded to and sensing a wide range of intricately engineered components. In reality, however, to integrate these sensors with typical manufactured parts it becomes critical to re-examine the limitations of conventional bonding techniques capable of adhering silicon, which is used as a substrate for the vast majority of micro-fabricated sensors, to a wide range of manufactured components made of, among other metals, steel. More importantly, a successful silicon-to-steel bonding process could lead to the deployment of MEMS sensors for various applications, including the health monitoring of key mechanical components in a wide range of industries.

For a device bond to be effective, it should possess certain characteristics that allow it to remain bonded to a component's surface. The bond strength should possess good mechanical characteristics, including high tensile, compressive, and fatigue strength, resistance to creep, and corrosion resistance. For example, the bond should preferably be able to withstand years in harsh, oily environments for applications in machine-related components. Furthermore, the stresses induced in the bonding material during the bonding process should be manageable, and damage to the manufactured component should be minimal. In addition, if bonded sensors are to be easily incorporated into production of these manufactured components, the bonding process should be rapid and repeatable.

Steel is used for a wide range of manufactured components, and the technologies utilized in bonding materials to steel are numerous and well developed. However, many of these techniques possess intrinsic limitations that prevent them from being utilized in bonding silicon sensors to steel. Polymeric adhesives, such as epoxies, for example, offer an inexpensive and simple approach to bonding silicon to steel, but their bonds typically exhibit long-term creep, poor corrosion resistance, and require excessive bonding times. Diffusion bonding is another method that can create a very strong bond. But the times required for the bonding process can range from minutes to hours, and the bonding temperatures can be very high. Brazing and welding operations form very strong bonds, but the temperatures are well above the point at which the tempering of high-hardness steel begins to change. Laser welding and microwave heating have been shown to work and provide localized heating in a rapid period of time, but they both require expensive equipment setups, with microwave heating necessitating a vacuum chamber. Also, micro-heaters have been demonstrated to deliver a high amount of heat to a localized region, but such features require additional device fabrication processes. Another possible bond technique is ultrasonic bonding because it is a rapid, low temperature process; however, the vibration inherent in the process could damage the MEMS structures.

Alternative techniques for advancing this technology would be desirable.

SUMMARY OF THE INVENTION

The present invention provides a bonding technique suitable for bonding a non-metal body, such as a silicon MEMS sensor, to a metal surface, such a steel component. The process is rapid enough to be compatible with typical manufacturing processes, and avoids any detrimental change in material properties of the metal surface arising from the bonding process. The bonding technique has many possible applications, including bonding of MEMS strain sensors to metal mechanical components. The inventive bonding technique uses inductive heating of a heat-activated bonding agent disposed between metal and non-metal objects to quickly and effectively bond the two without changing their material properties. Representative tests of silicon to steel bonding using this technique have demonstrated excellent bond strength without changing the steel's material properties. Thus, with this induction bonding approach, silicon MEMS devices can be manufacturably bonded to mechanical steel components for real time monitoring of the conditions/environment of a steel component.

In one aspect, the invention relates to a method of bonding a non-metal body to a metal surface comprising the steps of:
  a) contacting the non-metal body with the metal surface with a heat activated bonding agent therebetween; and
  b) heating the heat activated bonding agent with an inductive heater to bond the non-metal body to the metal surface.

These and other features of the invention are further described and exemplified in the detailed description below.

DETAILED DESCRIPTION OF SPECIFIC EMBODIMENTS

Reference will now be made in detail to specific embodiments of the invention. Aspects of the specific embodiments are illustrated in the accompanying drawings. While the invention will be described in conjunction with these specific embodiments, it will be understood that it is not intended to limit the invention to such specific embodiments. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Introduction

The bonding technique of the present invention is suitable for bonding a non-metal body, such as a silicon MEMS sensor, to a metal surface, such a steel component. The process is rapid enough to be compatible with typical manufacturing processes, and avoids any detrimental change in material properties of the metal surface arising from the bonding process. The technique is also applicable to a range of non-silicon, non-metal bodies including those composed of ceramic and glass, and to a range of non-steel metal surfaces, including surfaces composed of other ferromagnetic metals, such as iron and nickel, and composed of non-ferromagnetic metals, such as aluminum and copper.

The bonding technique has many possible applications, including bonding of MEMS strain sensors to metal mechanical components. The inventive bonding technique uses inductive heating of a heat-activated bonding agent disposed between metal and non-metal objects to quickly and effectively bond the two without changing their material properties. Representative tests of silicon to steel bonding using this technique have demonstrated excellent bond strength without changing the steel's material properties. Thus, with this induction bonding approach, silicon MEMS devices can be manufacturably bonded to mechanical steel components for real time monitoring of the conditions/environment of a steel component.

Figure 1:
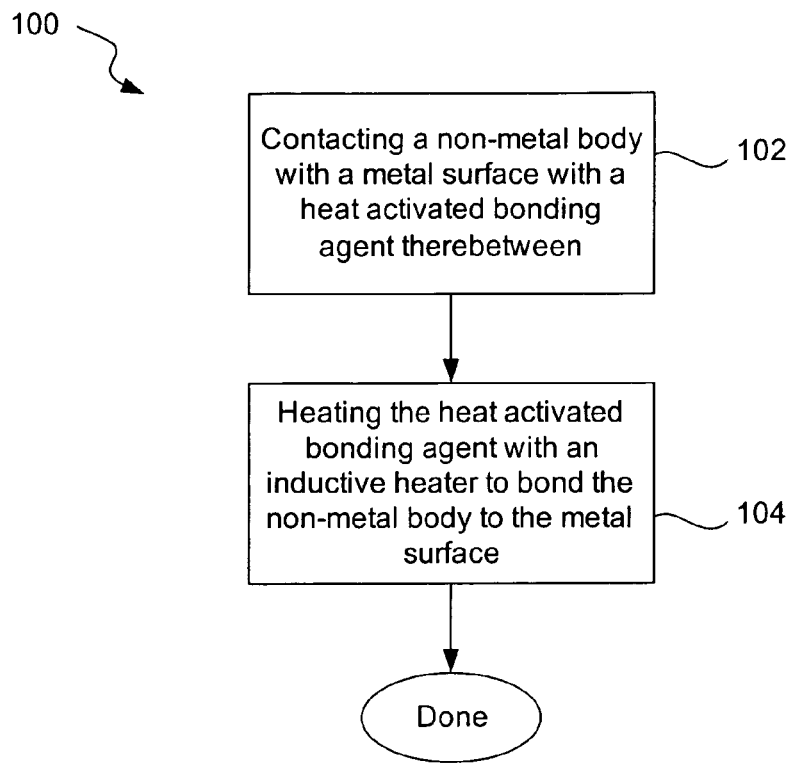
FIG. 1 illustrates a process flow chart for a method in accordance with the present invention.

Referring to FIG. 1, a process flow 100 of the method of the invention is shown. The method involves bonding a non-metal body to a metal surface by contacting the non-metal body with the metal surface with a heat activated bonding agent therebetween (102), and then heating the heat activated bonding agent with an inductive heater to bond the non-metal body to the metal surface (104). Any suitable heat-activated bonding agent may be used. Examples include solder, brazing material, and heat-setting adhesive where ferrous particles are mixed in to provide sufficient conductivity. When solder is used, a low-temperature lead-based or lead-free solder can be used. In preferred embodiments, the solder can be eutectic. An adhesion layer is typically used in conjunction with the solder in order the improve bond strength. The solder may be applied to the metal surface or the non-metal body prior to contacting the two. In a specific embodiment, the solder is applied to the non-metal body prior to contacting the non-metal body and the metal surface. In this embodiment, a small amount of pressure, at least about 1500 Pa, for example about 1800 Pa, is preferably applied to the non-metal body during heating to promote contact of the non-metal body, bonding agent and metal surface in order to improve the quality of the bond.

The non-metal body may be, for example, silicon, ceramic or glass. Silicon, in particular silicon MEMS devices, are used in some preferred embodiments. The non-metal surface may be ferromagnetic or non-ferromagnetic. Suitable ferromagnetic metals include steel, iron (Fe) and nickel (Ni), and steel is used in many particular embodiments, for example, steel bearing races and parallels. Suitable non-ferromagnetic metals include aluminum (Al) and copper (Cu).

Figure 2:
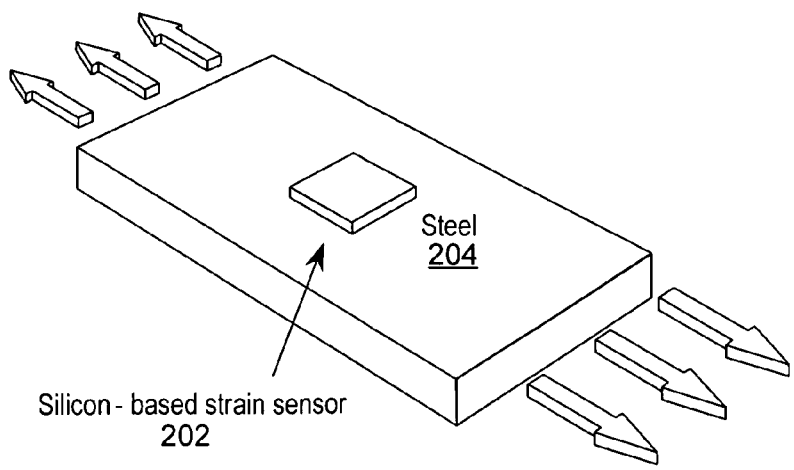
FIG. 2 illustrates a representation of an implementation of a non-metal to metal bond in accordance with the present invention, e.g., a silicon-based MEMS strain sensor bonded to a piece of steel (e.g., a bearing race).

As noted above, MEMS sensors, such as accelerometers, gas sensors, pressure sensors, and others are available and can be usefully applied when reliably bonded to engineered metal components in a manner compatible with large scale manufacturing processes. In particular, the invention provides a successful silicon-to-steel bonding process suitable for the deployment of MEMS sensors for various applications. FIG. 2 illustrates a basic example of such a deployment: a silicon-based MEMS strain sensor 202 is bonded to a piece of steel 204 (e.g., a bearing race). The sensor 202 could then provide real time data on the strain of the steel 204 as forces are applied to it.

The noted adhesion layer is generally a metal such as Ni, gold (Au), silver (Ag) or Cu. In many instances Ni is a preferred adhesion layer material. When the adhesion layer is Ni, a thin (e.g., 0.5-1 micron) solder layer may be applied to the adhesion layer to prevent oxidation of the Ni surface prior to bonding. Also, a seed layer is typically formed on the surface of the non-metal body for adherence of the adhesion layer. The seed layer is generally composed of one or a combination of metals, such as chromium, titanium, chromium-copper, chromium-nickel, chromium-gold, titanium-copper, titanium-nickel or titanium-gold.

The solder can be lead-containing (Pb/Sn) or lead-free, with lead-free being preferred for its health and environmental benefits. For a ferromagnetic metal, and at least some non-ferromagnetic metals (e.g., Cu), a suitable lead-free solder is a tin-silver-copper solder, such as 96.5Sn3Ag0.5Cu. For a non-ferromagnetic metal, e.g., Al, a suitable lead-free solder is a tin-zinc solder, such as 91Sn9Zn. A preferred method of solder deposition is one where the solder is a solder paste of alloyed microspheres in a matrix of solder flux. The type of flux employed depends upon the metal surface and those properties that will promote bonding to the metal. In a particular embodiment where the metal is steel, a rosin flux without halides may be used.

A particular advantage of the inductive heating method is its speed without damaging the metal. The inductive heating has a duration of less than 10 seconds, typically well less, with a duration of 5 seconds or less, for a 400-800 W inductive heating system. Typical effective durations may be from about 3-5 seconds. This short heating duration is suitable for large scale manufacturing processes, and the material properties of the metal are substantially unaffected by the soldering operation.

Further aspects of the invention that may be used to improve bond quality include, prior to application of the solder, preparing the metal surface for bonding by removing native oxide. This can be accomplished by cleaning, for example with a solvent such as acetone, and roughening the surface, for example with sandpaper.

Inductive Heating Bonding Process

Many previous or potential non-metal to metal bonding approaches rely on a bulk heating method. Inductive heating represents a different method of heat generation. Since the heat generation occurs locally within the material, heating can occur rapidly and heat generation may be isolated to a single, small location of the metal.

Figure 3:
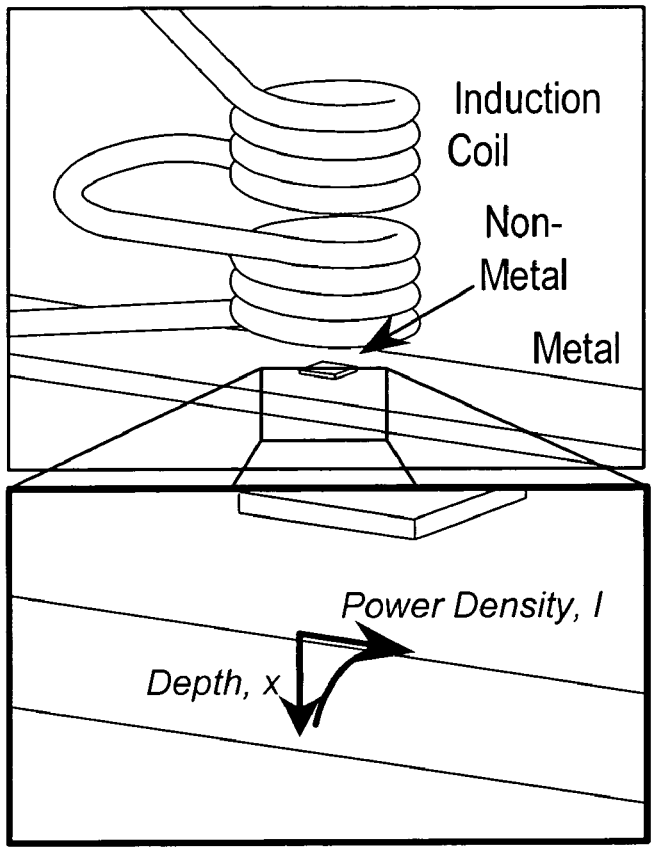
FIG. 3 illustrates an overview of inductive heating in accordance with the present invention.

Inductive heating is a fast, clean, and inexpensive process. FIG. 3 illustrates the fundamental principle of inductive heating, and relates it to the skin depth function according to which incident power density is transferred exponentially versus depth into the metal. By initiating a large, alternating current within an induction coil, a substantial alternating magnetic field is generated. This alternating magnetic field propagates a short distance into metals, producing eddy currents which cause Joule heating. Because of the low resistivity of metals, the high magnetic permeability constant of ferromagnetic metals (e.g., steel), and the high applied frequency of the inductive heater (acceptable frequencies can range broadly from about 10 kHz to 10 GHz; more typically from about 1 to 50 MHz; or 10 to 20 MHz; one specific example is 11.7 MHz), the Joule heating is localized to within the skin depth, $\delta$, of the metal. By definition, this is where 86% of the incident power is transferred to the metal exponentially from the surface, and for ferromagnetic materials, may be on the order of microns.

Because the majority of the heat generation is localized to within the skin depth, the temperature is theoretically the highest at the surface of the metal where the bond is formed. As a result, the material properties of the metal are less likely to be detrimentally modified by overheating in the bonding process. This has been demonstrated in the case of steel, as described further in the examples that follow.

Moreover, the governing skin depth function means that the inductive heating bonding technique of the present invention is also applicable to non-ferromagnetic metals potentially of interest, such as aluminum and copper. Because of the low resistivity of these metals and the high frequency of the induction heating system, the skin depth of these materials can be several tens of microns. Therefore, with enough incident energy from the induction heater, a sufficient amount of heat may be generated for this bonding process.

Figure 4:
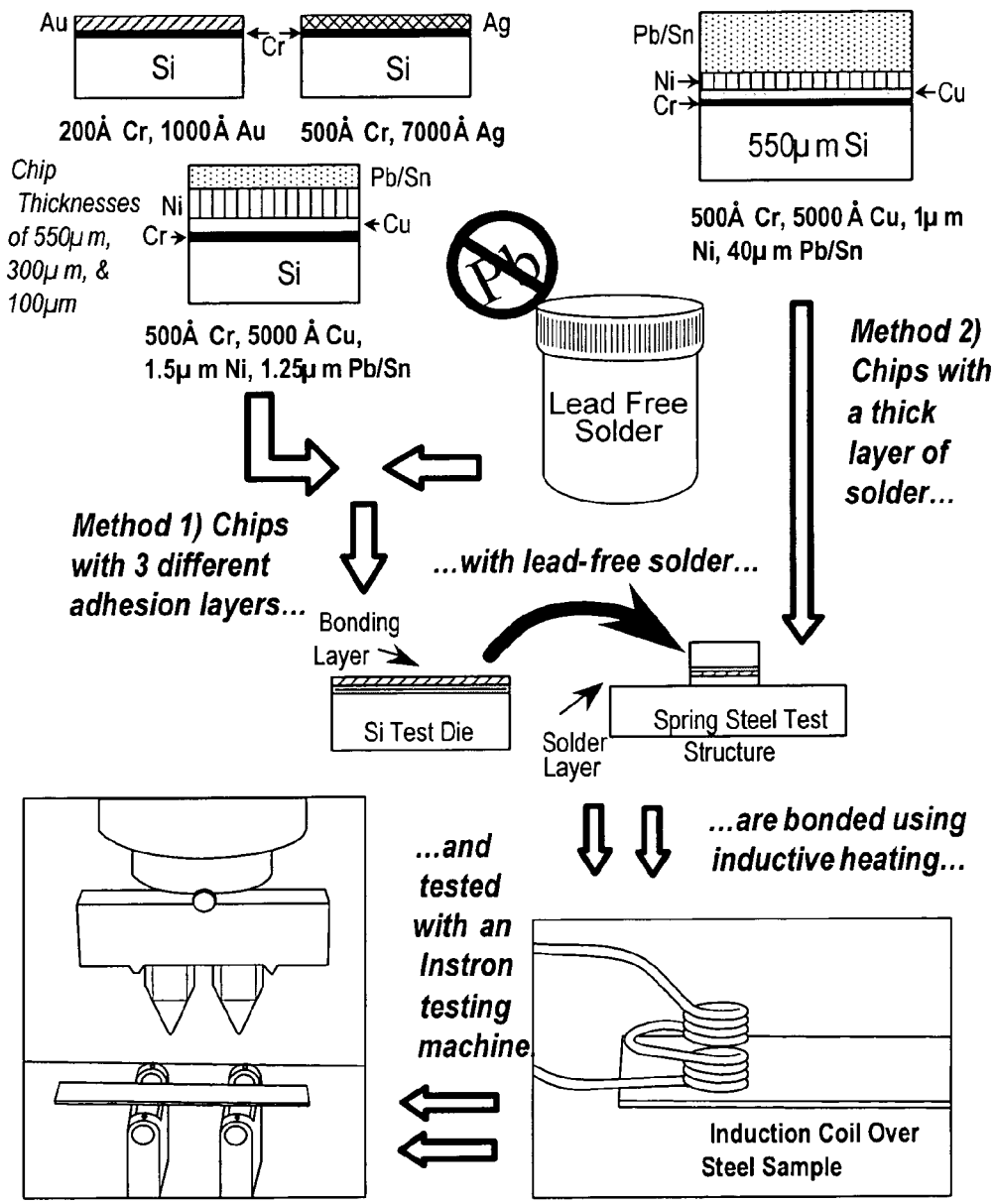
FIG. 4 illustrates a process flow for various bonding methods in accordance with the present invention.

FIG. 4 illustrates several process flows for non-metal to metal bonding using inductive heating in accordance with the present invention. The embodiments depicted and described refer to silicon and steel as the non-metal and metal materials, respectively, being bonded using eutectic solder and a variety of adhesion layers. Of course, as noted above, these materials represent only specific embodiments, and other suitable material combinations may be used in accordance with the invention, consistent with the guidance provided herein.

Silicon will not form a natural bond with steel at low temperatures. Several material systems compatible with both silicon and steel are therefore used to provide low-temperature eutectic solders and metallic adhesion layers. Low-temperature eutectic solders are advantageous because of their ability to bond well with steel and to meet the other noted parameters. Examples of suitable solders for silicon to steel bonding include 96.5Sn/3Ag/0.5Cu lead-free solder paste (Hi-Performance Lead-Free No-Clean Solder Paste, S3X58-M405, Koki Company Ltd.) and electroplated 63Sn/37Pb (Techni Solder MatteNF 820 HS 60/40, Technic Inc.). Another component of the bond is a metallic adhesion layer deposited onto the silicon surface to promote the intermetallic bonding of the silicon to the steel. As noted above, suitable examples include nickel (Ni), gold (Au), silver (Ag) or copper (Cu). In many instances Ni is a preferred adhesion layer material. When the adhesion layer is Ni, a thin (e.g., 0.5-1 micron) solder layer may be applied to the adhesion layer to prevent oxidation of the Ni surface prior to bonding. Some specific adhesion layer systems, as illustrated in FIG. 4, are:

Silver adhesion layer: 500 Å chromium/7000 Å silver thermally evaporated;

Gold Adhesion layer: 200 Å chromium/1000 Å gold thermally evaporated

Nickel adhesion layer: 500 Å chromium/5000 Å copper thermally evaporated/1.5 µm electroplated nickel (Techni Nickel Sulfamate, Technic Inc.)/1.25 µm electroplated 63Sn/37Pb eutectic solder (Techni Solder MatteNF 820 HS 60/40, Technic Inc.).

Also, a seed layer is typically formed on the surface of the non-metal body for adherence of the adhesion layer. The seed layer is can be composed of one or a combination of metals, such as chromium, titanium, chromium-copper, chromium-nickel, chromium-gold, titanium-copper, titanium-nickel or titanium-gold.

The process overview depicted in FIG. 4 shows two different basic processes, each with a different type of solder. The first approach (Method 1) uses lead-free solder paste and variety of different adhesion systems, noted above. Silicon (e.g., processed into MEMS) can be cleaned and have a seed layer of chromium and copper, for example, evaporated to the cleaned silicon surfaces. Nickel can then be electroplated to the silicon, along with a very thin layer of Pb/Sn solder to prevent the nickel from oxidizing. Alternatively, a comparable electroplatable lead-free solder may also be used. The silicon can then be placed upon a layer of bulk lead free solder paste (e.g., about 40 µm of 96.5Sn/3Ag/0.5Cu lead-free solder paste) deposited on a piece of steel.

Alternatively, according to another approach (Method 2) a layer of nickel is deposited onto a seed layer of Cr/Cu on a silicon body. Subsequently, a layer of solder (e.g., an about 40 µm thick layer of Pb/Sn) is electroplated to the surface of the nickel. The silicon with solder face down can then be placed upon a piece of steel.

In both methods, it should be noted that just prior to bonding, the surface of the steel is preferably roughened and cleaned to remove the native oxide and improve bonding and the potential for strain transfer, for example by sanding with medium grade sand-paper and cleaning with acetone. Also, a solder layer thickness of 40 µm was selected to overcome the localized surface roughness that might be encountered in the steel, but not too much thicker, since increased thickness in the solder layer would lead to strain attenuation in the bonding layer. A thicker layer, however, could certainly be adequate though for non-strain sensing applications.

The silicon on steel assembly is then placed under an induction coil, for example at a distance of approximately 5 to 10 mm. The inductive heating system is then initiated at a power ranging from about 400-600 W for about 3-5 seconds, for example. During this time, the steel is rapidly heated which melts the solder and forms the bond. For the second method, a pressure of greater than 1500 Pa, e.g., about 1800 Pa is applied to promote contact of the silicon, bonding agent and steel to improve the quality of the bond.

As detailed in the examples below, strong silicon to steel bonds were formed using these techniques.

EXAMPLES

The following examples are provided to illustrate and provide structural, compositional and performance details for a specific embodiment of the present invention. The examples are provided to exemplify and more clearly illustrate aspects of the present invention and are in no way intended to be limiting.

Example 1

Silicon to Steel Bonding and Testing

The process overview for the tests performed is shown in FIG. 4, described more generally above to address more general features of the invention. Two different basic processes were tested, each with a different solder. The first approach (Method 1) utilized lead-free solder paste and various adhesion layer systems. Silicon wafers with thicknesses of 550 μm, 300 μm, and 100 μm were cleaned in a Piranha bath (100:1, Sulfuric Acid:Hydrogen Peroxide at 120° C.) for 10 minutes, and a seed layer of chromium and copper was evaporated to the polished surfaces of the wafers. Nickel was then electroplated to the wafers, along with a very thin layer of Pb/Sn solder to prevent the nickel from oxidizing. Although a leaded solder was used in these experiments to serve as an oxidation barrier, a comparable, electroplatable solder may also be used.

The two solders used for this work were 96.5Sn/3Ag/0.5Cu lead-free solder paste (Hi-Performance Lead-Free No-Clean Solder Paste, S3X58-M405, Koki Company Ltd.) and electroplated 63Sn/37Pb (Techni Solder MatteNF 820 HS 60/40, Technic Inc.). Metallic adhesion layers deposited onto the surface of silicon wafers (p-type, (100), 10-50 Ω-cm) were used to promote the intermetallic bonding of the silicon to the steel, including:

Silver adhesion layer: 500 Å chromium/7000 Å silver thermally evaporated;
Gold adhesion layer: 200 Å chromium/1000 Å gold thermally evaporated;
Nickel adhesion layer: 500 Å chromium/5000 Å copper thermally evaporated/1.5 μm electroplated nickel (Techni Nickel Sulfamate, Technic Inc.)/1.25 μm electroplated 63Sn/37Pb eutectic solder (Techni Solder MatteNF 820 HS 60/40, Technic Inc.).

The silicon wafers were diced into 5×5 mm test specimens, and bonding was performed on 1095 spring steel parallels that were 6 in long, 1/32 in thick and 7/8 in to 1 3/16 in wide. The steel parallels were roughened with 150 grade sandpaper to remove the thick oxide present on the parallel surface and cleaned with acetone. Two bonding methods were tested using lead-free solder and electroplated 63Sn/37Pb solder, respectively.

For the first method, about 1 mm$^3$ in volume of lead-free solder paste was applied manually to the center of the steel sample, which resulted in a post-bonding thickness targeting approximately 40 μm. A silicon test specimen, from the aforementioned silicon chips with one of the three metallic adhesion layers, was then placed onto the solder with the adhesion layer contacting the solder paste. The steel was then placed on two 2.5×1×1/32 in$^3$ copper heat sink shims positioned under the lengthwise edges of the steel. This system was then placed 5-10 mm under the induction coil. The inductive heating system was then initiated at a power ranging from 400-600 W for 3-5 seconds. During this time, the steel was rapidly heated melting the solder and forming the bond.

For the second method, a 40 cm-thick, 63Sn/37Pb solder layer was deposited on a layer of nickel (the third type of metallic adhesion layer noted above). These "Solder-On-Chip" (SOC) test specimens were then placed onto the steel sample, and bonded with a pressure of about 1800 Pa in the aforementioned method.

Figure 5:
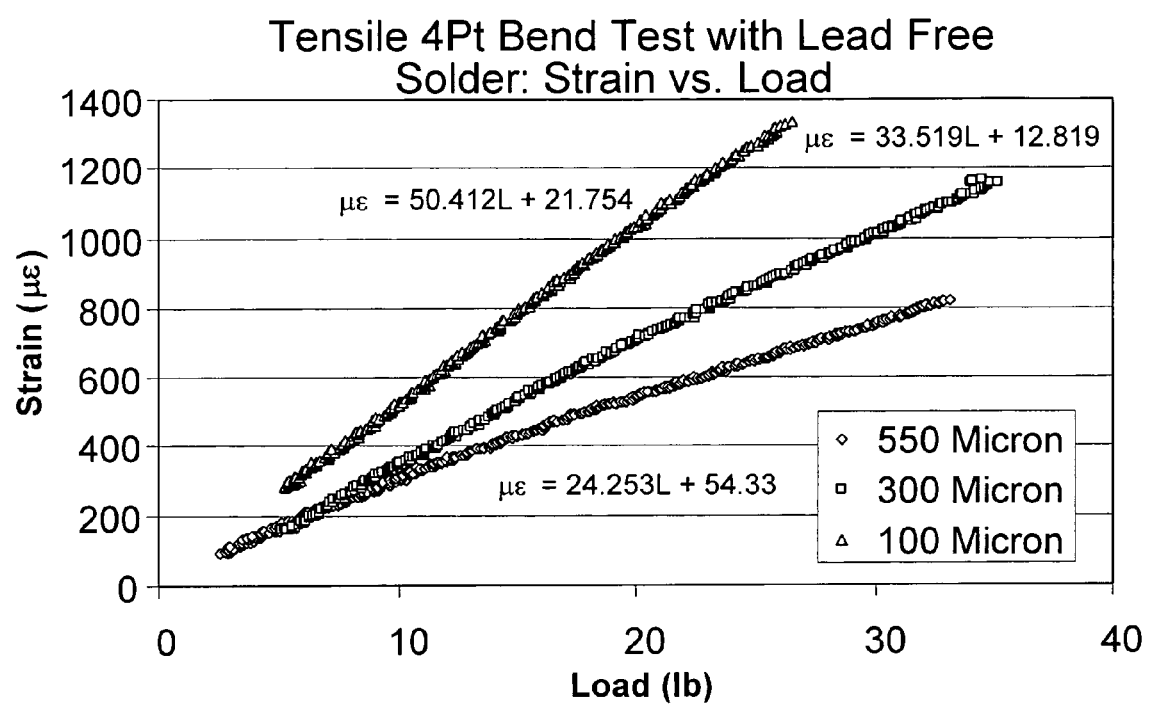
FIG. 5 is a plot of the strain vs. load results of the static tensile 4-point bend test for lead-free Method 1, as described in Example 1.
Figure 6:
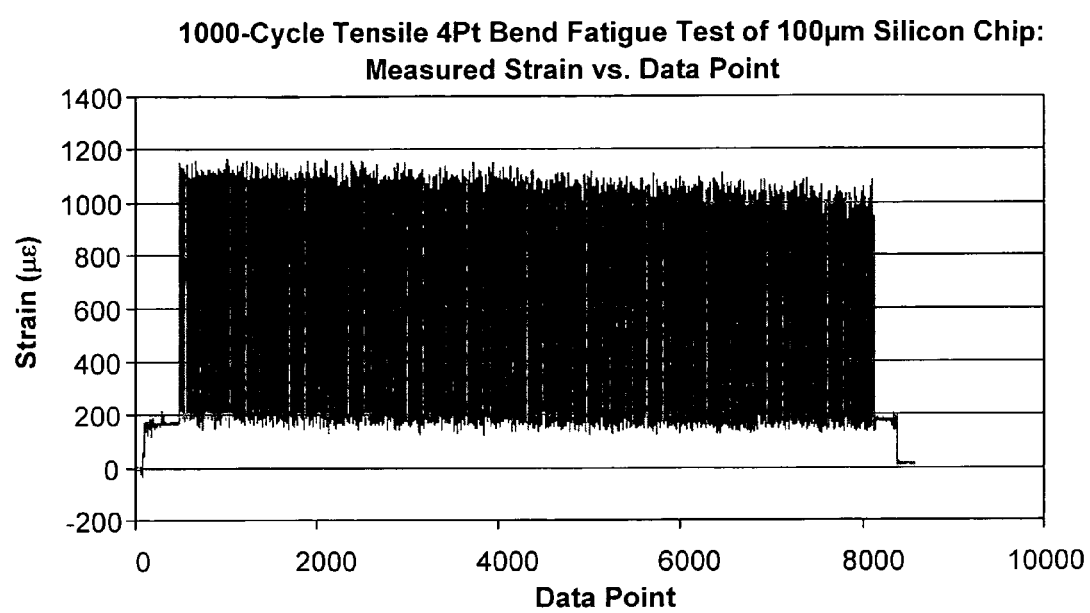
FIG. 6 is a plot of the output strain results for the tensile 4-point bend fatigue test for lead-free Method 1, as described in Example 1.

After bonding the chips to the steel parallels, strength tests were performed by placing foil strain gages onto the surface of the silicon and monitoring the strain transfer during the tests. Load vs. time and strain vs. time plots were generated, and results are shown in FIGS. 5 and 6. Shown in FIG. 5 is a plot of the strain vs. load results of the static tensile 4-point bend test for lead-free Method 1. The test was performed by slowly applying a bending load until the chip fractured or delaminated. As shown in the figure, the amount of strain transfer increases linearly with respect to time. This was consistent for all tests performed. Additionally, shown in FIG. 6 is a plot of the output strain results for the tensile 4-point bend fatigue test for lead-free Method 1. The test was performed by applying a load that would correspond to 1000 με at the surface of a bare steel parallel, and then removing that load, which constituted one cycle. One thousand cycles were applied at a frequency of approximately 1 Hz. The pre-load strain output arose from the 2.9 lb (12.93 N) weight of the upper component of the 4-point bend test jig, whereas the zero-load output was the strain measured with at the start and end of the test when this load was removed. As shown in the plot of FIG. 6, the bond displayed minimal creeping of the peak strain over time which was attributed to the fatiguing of the strain gauge epoxy, since the pre-load strain and the zero-load outputs were approximately equal before and after the test.

Example 2

Further Details of an Inductively Heated Silicon-to-Steel Bonding Protocol

The following protocol details for particular embodiments of the invention are applicable to the test processes described in Example 1:

1) Silicon Chip Preparation:
   a. Silicon wafers (10-50 Ω-cm resistivity, 100, p-type (B)[1]) are cleaned in Piranha bath (100:1, Sulfuric Acid:Hydrogen Peroxide at 120° C.) for 10 minutes
   b. An adhesion layer of one of the following sets is then deposited onto the wafer
      i. Evaporated 200 Å Chromium (or titanium)/Evaporated 1000 ÅGold—used with bonding method 1 (discussed below)
      ii. Evaporated 500 Å Chromium (or titanium)/Evaporated 7000 ÅSilver—used with bonding method 1 (discussed below)
      iii. Evaporated 200 Å Chromium (or titanium)/Evaporated 1000 ÅCopper/2 μm Electroplated Nickel/1 μm Electroplated Eutectic Pb/Sn Solder—used with bonding method 1 (discussed below)
      iv. Evaporated 200 Å Chromium (or titanium)/Evaporated 1000 ÅCopper/2 μm Electroplated Nickel/40 cm Electroplated Eutectic Pb/Sn Solder—used with bonding method 2 (discussed below)
   c. Wafers are then coated in photoresist, diced into pieces that are 5×5 mm specimen, and the photoresist is removed with acetone.
2) Steel Preparation:
   a. 1095 steel parallels were obtained from McMaster-Carr (product # 8644A7), with the following dimensions:
      i. Length: 6 in
      ii. Thickness: 1/32 in iii. Width: Variable, from 0.5 in to 1.25 in, though the tests were performed on parallels with a narrower range of 7/8 in to 1 3/16 in.
b. Cleaning: Steel parallels were cleaned with acetone to remove thick layer of grease.
c. Surface Roughening: Steel parallels, with an initial visibly thick layer of oxide, were roughened with 150 grit sandpaper for a few seconds to remove the oxide. This exposes the shiny metallic surface of the pure steel. The surface roughness then becomes approximately 5-8 μm peak-to-valley.

3) Bonding Procedure, Method 1—solder paste with silicon chips with aforementioned adhesion layers:
  a. Lead-free solder paste of 96.5Sn/3Ag/0.5Cu is deposited onto the center of the cleaned steel.
  b. The silicon chip is placed onto the solder paste, with the adhesion layer contacting the solder.
  c. The steel is then placed on non-conductive blocks, with two copper shims (1×2.5×1/32 inch) placed 0.25 inch under the steel.
  d. The blocks are positioned, such that the steel-to-coil base distance is approximately 9 mm.
  e. For visual characterization, two small "dots" of solder paste were placed on the steel just beyond opposing corners of the silicon sample.
  f. With a power of 800 W, the induction heating system is initiated. The sample is heated. When the two dots of solder have melted, the system is turned off, which may occur between 3 and 5 seconds, and the silicon sample is bonded to the steel.

4) Bonding Procedure, Method 2—solder on silicon chips:
  a. Follow steps 3c-f. Exceptions include the following:
    i. Bonding should be performed quickly after the surface roughening process.
    ii. Pressure of at least 1500 Pa, for example about 1800 Pa, is applied to form the bond.
    iii. A small amount of flux may improve the bonding characteristics of the solder-to-steel interface.

With regard to the foregoing:
  a. Titanium can replace chromium. The thicknesses may be thicker than the specified values, which may promote a better bond through a thicker layer of intermetallic compounds.
  b. The solder capping layer is optional, depending on whether or not the embedded flux will break down any nickel oxide that may be present on the surface of the electroplated nickel.
  c. The non-metal body size need not be 5×5 mm, of course, but could definitely be smaller and possibly larger depending on the coil geometry and the thermal gradients in the steel that are present during the bonding process.
  d. Solder paste does not necessarily have to be the above alloy, but any composition that will wet to both the adhesion layers on the non-metal (in this case, silicon) and to the metal to which it is being bonded, (in this case, steel).
  e. The dimensions of the heat sink shims used at the edges of the parallels during the bonding experiments to control temperature gradients are just one example, and can vary depending on what will keep the desired temperature threshold. Additionally, a carefully positioned workpiece or coil design may mitigate or eliminate the need for heat sinks altogether.
  f. The temperature characterization associated with temperature indicating paints was done to ensure, for research purposes, that the area around the bonding layer hit the temperature to melt the solder, while allowing the power to be cut when the temperature was reached. The times for bonding were not always the same, but very close to one another (around 4 seconds average). In an industrial setting, with the input parameters refined to a six-sigma level, it would be possible to repeatably hit the target temperature for a given time with more precision than is possible in a research setting. The incorporation of an IR temperature feedback system could be incorporated as well.
  g. Wet solder flux was not used in these experiments in order to demonstrate a "dry" process, without wet chemicals. However, the incorporation of a small amount of flux, where otherwise permissible, would likely improve the bonding between the two materials.

Example 3

Hardness Testing

The bonding process has been demonstrated to do no damage to steel of a high hardness, for example as described below. Because of the nature of inductive heating, the alternating electromagnetic field penetrates the steel to a depth on the order of only a few microns. Therefore, the heat is essentially generated only at the steel surface from Joule heating, and the rest of the sample, although heated through conduction, can remain well below the temperatures at which heat treated steel begins to change. The damage to the steel was verified on a bearing steel race, whereby the hardness was measured before and after bonding the silicon chip to the race and the temperature at the steel surface was monitored with Tempilaq G Temperature Indicating Liquid paint. Preventing damage to the steel is important because the bonding of silicon chips to steel would generally be performed after the heat treatment to the steel in an industrial manufacturing process.

Hardness tests were performed on bearing steel to determine the damage to the heat treatment. These tests were performed as follows:

A bearing race was obtained and cleaned using the method specified in Examples 1 and 2. Hardness tests were performed before induction heating. At multiple locations on the bearing, the hardness measured a value of around Rockwell 62C. Temperature indicating paints of 149° C., 204° C., 253° C. and 316° C. were placed as dots along a circle 5 mm in diameter on the bearing race. The bearing was placed approximately 5 mm from the coil base with the axis of the coil along the axis of the indicating paint circle. The sample was heated at various different powers and different times, one of them being 1500 W for 5.5 sec. Hardness tests performed in the region gave an average value of Rockwell 62.5C. The increase in the hardness could be from a localized increase in the hardness of the tested area—more importantly, the hardness didn't decrease significantly. Solder paste was placed onto the bearing race, and a silicon chip was placed onto this layer. The sample was heated and bonded under the same conditions.

Example 4

Operational Environment Tests

Similar bonding has been shown to withstand several months submerged in various fluids and oils at elevated temperatures. Such lubricants and fluids are present in everyday automobiles and industrial machinery, likely operational environments for applications of this technology.

Other Aspects

The geometry of the workpiece plays a significant role in whether or not the workpiece will rapidly heat to bonding temperatures in the desired area. For example, the samples that have heated rapidly because the thermal capacitance are small compared to a substantially thicker workpiece that would be common in some desired implementations. However, possible ways to address this issue include using a higher power induction heater, magnetic flux concentrators, or a redesigned coil.

Heat is continually being conducted away from the workpiece area under the coil. As such, there are certain areas that will heat rapidly without the incorporation of heat sinks. For the steel parallels used in the experiments described herein, the areas that would heat the quickest were the lengthwise-sides of the parallel closest to the area the coil. To prevent the overheating of these areas, copper shim heat sinks were used to pull heat away from these edges to reduce the significant thermal gradients that develop at the edges. This demonstrates that the proper deployment of heat sinks can play a beneficial role in the inductive heating bonding process. Determining the location of the position of the heat sinks, the heat sink material, and the heat sink geometry is a matter of routine experimentation, and once the parameters are identified, they are repeatable.

The geometry of the coil also has an impact on how fast the workpiece will heat inductively. In the experiments described herein, an 8-turn coil with a pitch of 3.25 mm and an ID of 13 mm was used. This provides a concentrated magnetic field, with good coupling to the steel. However, if the diameter of the coil were to increase, the concentration of the magnetic field would decrease, there might not be as efficient a coupling with the steel for the same input power, and the heat generation would decrease. Furthermore, the test coil had an electrode connection at the base of the coil, as shown in FIG. 3. This results in higher temperatures that are generated in the steel below this region.

The effective stiffness of the bond layer might be improved, and its yielding reduced (which should theoretically reduce strain attenuation) by modifying the bond layer through the use of a solder with a higher Young's modulus of elasticity, or the inclusion of microparticles in the bonding layer.

The invention can also be implemented in a bond pad format if desired. Rather than electroplating over the entire underside of the MEMS chip, electrodeposited nickel bond pads maybe be fabricated through a one-step lithography process. After the electrodeposition and subsequent seed layer removal, solder paste may be screen printed onto the nickel bond pads. Bonding is then performed as described herein, for example in Example 1.

CONCLUSION

The present invention provides a method of rapidly and effectively bonding non-metals and metals using inductive heating. For example, the method can bond silicon to steel using low-temperature eutectic solders and adhesion layers of evaporated gold, evaporated silver, or electroplated nickel. The bonding method was also found to do minimal damage to heat treated steel. Tests performed to monitor the condition of the bond and to assess the amount of strain transferred through the silicon specimen show that the bonding layer is able to sustain different methods of loading. The results demonstrate a potentially manufacturable solution for the large-scale bonding of silicon to steel for sensor applications, among other non-metal to metal bonding applications.

Although the foregoing invention has been described in some detail for purposes of clarity of understanding, it will be apparent that certain changes and modifications may be practiced within the scope of the invention. It should be noted that there are many alternative ways of implementing both the process and compositions of the present invention. Accordingly, the present embodiments are to be considered as illustrative and not restrictive, and the invention is not to be limited to the details given herein.

It is claimed:

1. A method of bonding a non-metal body to a metal surface comprising the steps of:
   a) contacting a silicon device with a steel mechanical component with a heat activated bonding agent therebetween; and
   b) heating the heat activated bonding agent by heating the component with an inductive heater to bond the silicon device to the steel mechanical component.

2. The method of claim 1, wherein the heat activated bonding agent is selected from the group consisting of solder, brazing material, and heat-setting adhesive.

3. The method of claim 1, wherein the silicon device is a silicon chip.

4. The method of claim 1, wherein the silicon device comprises a MEMS device.

5. The method of claim 1, wherein the steel comprise a bearing race.

6. The method of claim 2, wherein the heat activated bonding agent comprises solder.

7. The method of claim 4, wherein the MEMS device is a MEMS sensor.

8. The method of claim 5, wherein the silicon device comprises a MEMS strain sensor.

9. The method of claim 7, wherein the MEMS sensor is an accelerometer.

10. The method of claim 7, wherein the MEMS sensor is a gas sensor.

11. The method of claim 7, wherein the MEMS sensor is a pressure sensor.

12. The method of claim 6, wherein the solder is applied to the steel mechanical component prior to contacting the silicon device and the metal surface.

13. The method of claim 6, wherein the solder is applied to the silicon device prior to contacting the silicon device and the metal surface.

14. The method of claim 6, further comprising an adhesion layer between the non-metal body and metal surface.

15. The method of claim 6, wherein the solder comprises Pb.

16. The method of claim 6, wherein the solder is Pb-free.

17. The method of claim 6, wherein the solder comprises flux.

18. The method of claim 6, wherein the inductive heating has a duration of less than 10 seconds.

19. The method of claim 6, wherein the inductive heating has a duration of less than 5 seconds.

20. The method of claim 6, wherein the material properties of the steel are substantially unaffected by the soldering operation.

21. The method of claim 6, wherein, prior to application of the solder, the steel surface is prepared for bonding by removing native oxide.

22. The method of claim 13, wherein a pressure is applied during heating to promote contact of the silicon device, bonding agent and metal surface.

23. The method of claim 14, wherein the adhesion layer comprises a metal.

24. The method of claim 16, wherein the solder is a tin-silver-copper solder.

25. The method of claim 21, wherein the surface preparation comprises cleaning and roughening.

26. The method of claim 23, wherein the adhesion layer metal is selected from the group consisting of Ni, Au, Ag and Cu.

27. The method of claim 26, wherein the adhesion layer metal is Ni.

28. The method of claim 27, wherein a thin layer of a solder is applied to the adhesion layer to prevent oxidation prior to bonding.

29. A method of bonding a non-metal body to a metal surface comprising the steps of:
   a) contacting the non-metal body with a non-ferromagnetic metal surface selected from the group consisting of Al and Cu with a heat activated bonding agent therebetween; and
   b) heating the heat activated bonding agent by heating the metal surface with an inductive heater to bond the non-metal body to the metal surface.

30. The method of claim 29, wherein the metal surface is Al, the heat activated bonding agent comprises solder and the non-metal body comprises silicon.

31. The method of claim 30, wherein the solder is a tin-zinc solder.

32. A method of bonding a non-metal body to a metal surface comprising the steps of:
   a) forming a seed layer on the surface of the non-metal body;
   b) forming an adhesion layer on the seed layer;
   c) contacting the non-metal body with the metal surface with the seed layer, adhesion layer and a heat activated bonding agent therebetween; and
   d) heating the heat activated bonding agent by heating the metal surface with an inductive heater to bond the non-metal body to the metal surface.

33. The method of claim 32, wherein the seed layer is selected from chromium-copper, chromium-nickel, chromium-gold, titanium-copper, titanium-nickel, titanium-gold, chromium and titanium.

34. A method of bonding a silicon body to a steel surface comprising the steps of:
   a) forming an adhesion layer of nickel on a surface of the silicon body;
   b) applying solder to the steel surface;
   c) placing the silicon body on the steel surface with the layer of nickel adjacent to the solder; and
   d) heating the solder by heating the steel surface with an inductive heater for less than 5 seconds to solder the nickel layer to the steel surface.

* * * * *